United States Patent
Malouin, Jr. et al.

(10) Patent No.: US 10,903,141 B2
(45) Date of Patent: Jan. 26, 2021

(54) THERMAL MANAGEMENT OF RF DEVICES USING EMBEDDED MICROJET ARRAYS

(71) Applicant: Massachusetts Institute of Technology, Cambridge, MA (US)

(72) Inventors: Bernard A. Malouin, Jr., Westford, MA (US); James Paul Smith, Chelmsford, MA (US); Eric A. Browne, Westford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/712,316

(22) Filed: Dec. 12, 2019

(65) Prior Publication Data

US 2020/0168526 A1    May 28, 2020

Related U.S. Application Data

(63) Continuation of application No. 15/797,784, filed on Oct. 30, 2017, now Pat. No. 10,651,112.
(Continued)

(51) Int. Cl.
*H01L 23/473* (2006.01)
*H01L 21/48* (2006.01)
(Continued)

(52) U.S. Cl.
CPC ........ *H01L 23/4735* (2013.01); *F28D 1/0246* (2013.01); *F28F 3/12* (2013.01);
(Continued)

(58) Field of Classification Search
CPC ................ H01L 23/4336; H01L 23/4735
See application file for complete search history.

(56) References Cited

U.S. PATENT DOCUMENTS

| 5,021,924 | A | 6/1991 | Kieda et al. |
| 5,264,984 | A | 11/1993 | Akamatsu |

(Continued)

OTHER PUBLICATIONS

Browne, Eric A. et al., "Experimental Investigation of Single-Phase Microjet Array Heat Transfer", J. Heat Transfer, Apr. 2010, 132(4):041013 (9 pages), https://doi.org/10.1115/1.4000888 (Year: 2010).*

(Continued)

*Primary Examiner* — Robert J Hoffberg
(74) *Attorney, Agent, or Firm* — Nields, Lemack & Frame, LLC

(57) ABSTRACT

The present invention generally relates to a microjet array for use as a thermal management system for a heat generating device, such as an RF device. The microjet array is formed in a jet plate, which is attached directly to the substrate containing the heat generating device. Additional enhancing features are used to further improve the heat transfer coefficient above that inherently achieved by the array. Some of these enhancements may also have other functions, such as adding mechanical structure, electrical connectivity or pathways for waveguides. This technology enables higher duty cycles, higher power levels, increased component lifetime, and/or improved SWaP for RF devices operating in airborne, naval (surface and undersea), ground, and space environments. This technology serves as a replacement for existing RF device thermal management solutions, such as high-SWaP finned heat sinks and cold plates.

19 Claims, 16 Drawing Sheets

Related U.S. Application Data

(60) Provisional application No. 62/415,704, filed on Nov. 1, 2016, provisional application No. 62/415,739, filed on Nov. 1, 2016.

(51) Int. Cl.
   *F28D 1/02* (2006.01)
   *F28F 3/12* (2006.01)
   *F28F 13/06* (2006.01)
   *H05K 7/20* (2006.01)

(52) U.S. Cl.
   CPC .......... *F28F 13/06* (2013.01); *H01L 21/4871* (2013.01); *H05K 7/20254* (2013.01); *F28F 2260/02* (2013.01)

(56) References Cited

U.S. PATENT DOCUMENTS

| | | | |
|---|---|---|---|
| 5,349,831 A | 9/1994 | Daikoku et al. | |
| 5,353,865 A * | 10/1994 | Adiutori | F28F 13/02 165/133 |
| 5,768,103 A | 6/1998 | Kobrinetz et al. | |
| 6,105,373 A | 8/2000 | Watanabe et al. | |
| 6,650,542 B1 | 11/2003 | Chrysler et al. | |
| 7,511,957 B2 | 3/2009 | Campbell et al. | |
| 7,557,002 B2 * | 7/2009 | Wells | H01L 21/3221 257/E21.017 |
| 7,731,079 B2 * | 6/2010 | Campbell | H01L 23/473 228/245 |
| 7,956,416 B2 * | 6/2011 | Wells | H01L 27/10873 257/347 |
| 7,978,473 B2 * | 7/2011 | Campbell | H01L 23/473 361/699 |
| 7,992,627 B2 | 8/2011 | Bezama et al. | |
| 8,426,919 B2 * | 4/2013 | Wells | H01L 29/7833 257/347 |
| 8,485,147 B2 | 7/2013 | Liu et al. | |
| 8,643,173 B1 * | 2/2014 | Rau | H05K 7/2029 257/714 |
| 8,659,896 B2 | 2/2014 | Dede et al. | |
| 8,786,078 B1 * | 7/2014 | Rau | H01L 23/4735 257/714 |
| 8,912,643 B2 | 12/2014 | de Bock et al. | |
| 8,944,151 B2 * | 2/2015 | Flotta | H01L 23/4735 165/104.21 |
| 9,099,295 B2 | 8/2015 | Kuhlmann et al. | |
| 9,131,631 B2 * | 9/2015 | Joshi | H05K 7/20936 |
| 9,165,857 B2 | 10/2015 | Song et al. | |
| 9,252,069 B2 | 2/2016 | Bhunia et al. | |
| 9,341,104 B2 | 5/2016 | Liu et al. | |
| 9,445,526 B2 | 9/2016 | Zhou et al. | |
| 9,484,284 B1 | 11/2016 | Gambin et al. | |
| 9,622,380 B1 | 4/2017 | Joshi et al. | |
| 9,980,415 B2 | 5/2018 | Zhou et al. | |
| 10,306,802 B1 * | 5/2019 | Ditri | H01L 23/3732 |
| 10,651,112 B2 | 5/2020 | Malouin et al. | |
| 10,665,529 B2 | 5/2020 | Smith et al. | |
| 2004/0141034 A1 | 7/2004 | Usui et al. | |
| 2005/0183844 A1 | 8/2005 | Tilton et al. | |
| 2006/0207746 A1 | 9/2006 | Bhatti et al. | |
| 2006/0250774 A1 | 11/2006 | Campbell et al. | |
| 2007/0272392 A1 | 11/2007 | Ghosh et al. | |
| 2007/0274045 A1 | 11/2007 | Campbell et al. | |
| 2008/0037221 A1 | 2/2008 | Campbell et al. | |
| 2009/0095444 A1 | 4/2009 | Bezama et al. | |
| 2009/0288807 A1 | 11/2009 | Yang et al. | |
| 2010/0328882 A1 | 12/2010 | Campbell et al. | |
| 2011/0210400 A1 | 9/2011 | Wells et al. | |
| 2012/0113191 A1 | 5/2012 | Silverbrook | |
| 2012/0170222 A1 | 7/2012 | Dede et al. | |
| 2012/0205071 A1 | 8/2012 | Yang | |
| 2012/0212907 A1 | 8/2012 | Dede | |
| 2013/0027878 A1 | 1/2013 | Campbell et al. | |
| 2013/0027883 A1 | 1/2013 | Campbell et al. | |
| 2013/0027884 A1 | 1/2013 | Campbell et al. | |
| 2013/0032311 A1 | 2/2013 | Bhunia et al. | |
| 2014/0190665 A1 | 7/2014 | Joshi et al. | |
| 2014/0204532 A1 | 7/2014 | Mehring | |
| 2014/0284787 A1 | 9/2014 | Joshi | |
| 2015/0043164 A1 | 2/2015 | Joshi | |
| 2015/0348869 A1 | 12/2015 | Joshi et al. | |
| 2016/0007499 A1 | 1/2016 | Song et al. | |
| 2016/0123637 A1 | 5/2016 | Moreno et al. | |
| 2016/0183409 A1 | 6/2016 | Zhou et al. | |
| 2016/0240419 A1 | 8/2016 | Sieber et al. | |
| 2016/0369740 A1 | 12/2016 | Mackenzie | |
| 2017/0092565 A1 | 3/2017 | Chen et al. | |
| 2017/0094837 A1 | 3/2017 | Joshi et al. | |
| 2017/0105313 A1 | 4/2017 | Shedd et al. | |
| 2017/0122476 A1 | 5/2017 | Diaz et al. | |
| 2018/0031330 A1 | 2/2018 | Roberts et al. | |
| 2018/0145010 A1 | 5/2018 | Fukuoka et al. | |
| 2018/0160565 A1 | 6/2018 | Parida | |
| 2018/0166359 A1 | 6/2018 | Fukuoka | |
| 2019/0013258 A1 | 1/2019 | Malouin et al. | |
| 2020/0027819 A1 | 1/2020 | Smith et al. | |

OTHER PUBLICATIONS

Office action dated Sep. 8, 2020 in co-pending U.S. Appl. No. 16/844,446.

International Search Report and Written Opinion dated Jan. 5, 2018 in corresponding PCT application No. PCT/US2017/059030.

International Search Report and Written Opinion dated Sep. 27, 2018 in co-pending PCT application No. PCT/US2018/042809.

Office action dated Sep. 18, 2018 in co-pending U.S. Appl. No. 15/797,784.

Office action dated Apr. 30, 2019 in co-pending U.S. Appl. No. 15/797,784.

Final rejection dated Oct. 29, 2019 in co-pending U.S. Appl. No. 15/797,784.

Notice of allowance dated Feb. 20, 2020 in co-pending U.S. Appl. No. 15/797,784.

Office action dated Apr. 1, 2019 in co-pending U.S. Appl. No. 16/039,492.

Final rejection dated Aug. 19, 2019 in co-pending U.S. Appl. No. 16/039,492.

Notice of allowance dated Jan. 13, 2020 in co-pending U.S. Appl. No. 16/039,492.

* cited by examiner

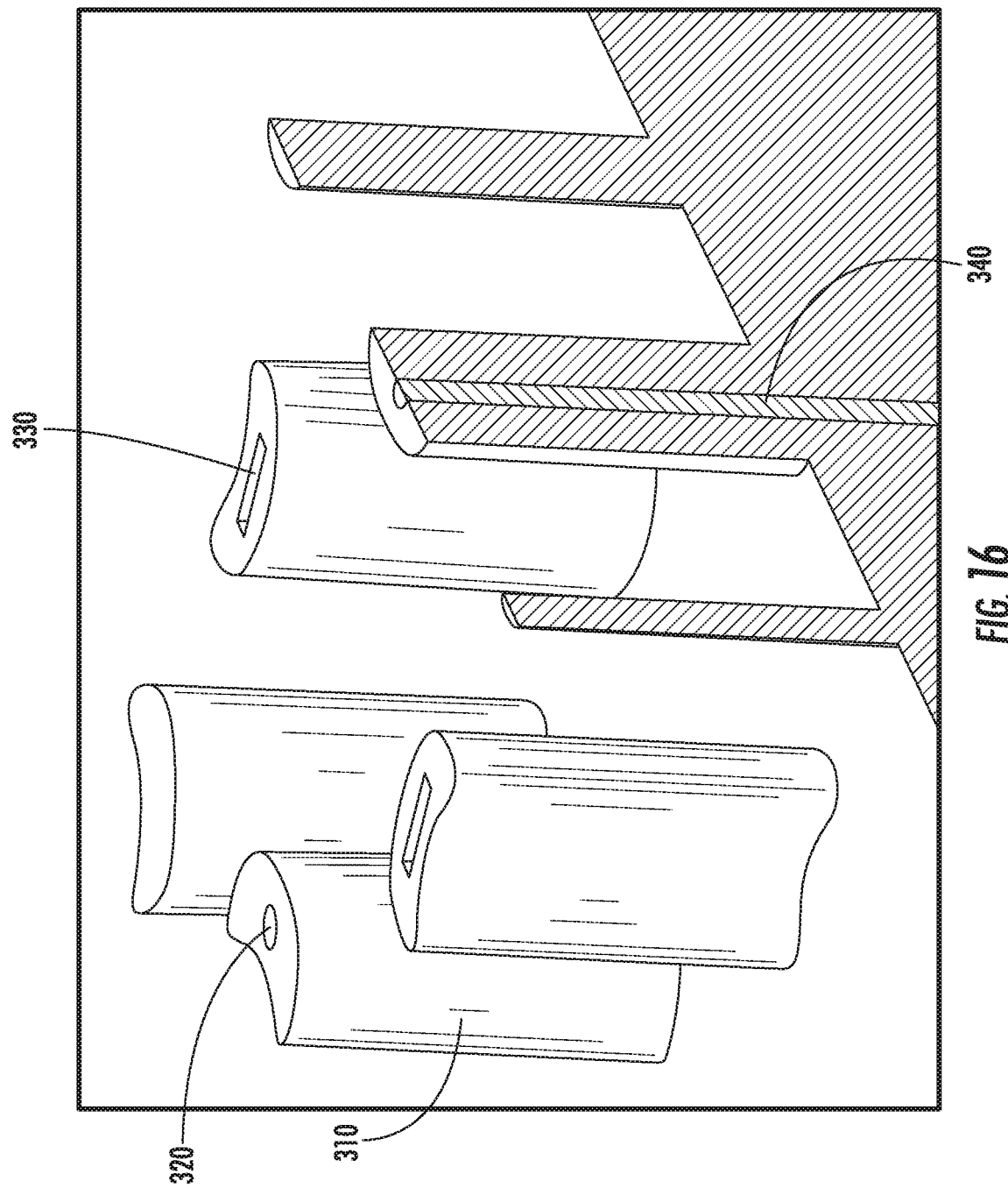

THERMAL MANAGEMENT OF RF DEVICES USING EMBEDDED MICROJET ARRAYS

This application is a Continuation of U.S. patent application Ser. No. 15/797,784 filed Oct. 30, 2017, which claims priority to U.S. Provisional Application Ser. No. 62/415,704, filed Nov. 1, 2016 and U.S. Provisional Application Ser. No. 62/415,739, filed Nov. 1, 2016, the disclosures of which are incorporated by reference in their entireties.

This invention was made with Government support under Contract No. FA8721-05-C-0002 awarded by the U.S. Air Force. The Government has certain rights in the invention.

BACKGROUND OF THE INVENTION

Many electronic components, such as processing units, and radio frequency (RF) devices, are commonly used in many of today's circuits and generate significant amounts of heat. For example, RF devices, such as high electron mobility transistors (HEMTs), are commonly used in radar (aircraft surveillance, weather surveillance, tactical); electronic warfare (EW), including jamming; RF communication systems; and other applications. Processing units, such as CPUs, are commonly used in computers, laptops, mobile electronics, and other applications.

A limiting factor in many of these applications is the maximum component temperature of the heat generating device, which may occur, for example, within the gate region of a HEMT. Component lifetime is a function of maximum temperature, and as such, a trade-off is often made between lifetime, maximum power output, and/or duty cycle.

The maximum component temperature in these heat generating devices is governed by heat transfer at several layers.

First, the conductive thermal resistance through the heat generating component itself is a factor in determining the maximum component temperature. The electrically active region of a heat generating device is typically located on one side of a semiconductor substrate, which may be, for example, silicon, gallium nitride, or gallium arsenide. This is the region where waste heat is generated. This heat must be conducted through the substrate before being dissipated through the thermal management system. Thermal resistance scales with thickness.

Second, the heat transfer from the surface of the semiconductor substrate to the thermal management system is a factor in determining the maximum component temperature. Thermal management systems usually conduct heat from the heat generating device into a spreader or heat sink. These systems then dissipate the heat to the ambient environment, such as via free convection, conduction, or radiation, or to a coolant, using forced convection.

Existing technologies use finned heat sinks, cold plates, microchannels, or radiators for this purpose. Thus, the heat transfer from the heat generating device can be limited by the performance of these technologies. For example, these technologies usually rely on the presence of a thermal interface material (TIM) between the component and the thermal management system. The thermal interface material, even if chosen to have low resistance, still reduces the efficiency of any solution.

Further, the size, weight, and power (SWaP) of existing thermal management solutions often drives the design of these systems and can limit their performance. For example, the system in which the heat generating device is contained may be compact, limiting the ability to transfer the heat to a cooler ambient location.

Therefore, it would be beneficial if there were a thermal management system that addressed these challenges by minimizing the conductive and convective thermal resistance in heat generating devices and reducing or eliminating the dependence on SWaP-constraining heat sinks, spreaders, and similar devices.

SUMMARY OF THE INVENTION

The present invention generally relates to a microjet array for use as a thermal management system for a heat generating device, such as an RF device. The microjet array is formed in a jet plate, which is attached directly to the substrate containing the heat generating device. Additional enhancing features are used to further improve the heat transfer coefficient above that inherently achieved by the array. Some of these enhancements may also have other functions, such as adding mechanical structure, electrical connectivity or pathways for waveguides. This technology enables higher duty cycles, higher power levels, increased component lifetime, and/or improved SWaP for RF devices operating in airborne, naval (surface and undersea), ground, and space environments. This technology serves as a replacement for existing RF device thermal management solutions, such as high-SWaP finned heat sinks and cold plates.

In one embodiment, an assembly is disclosed. The assembly comprises a semiconductor component, having a heat generating device disposed therein; and a jet plate, directly bonded to an impingement surface of the semiconductor component, where a reservoir is formed within the assembly between the jet plate and the semiconductor component, wherein the jet plate comprising a microjet and an exhaust port in communication with the reservoir. In certain embodiments, a single-phase fluid is disposed in the reservoir. In certain embodiments, the jet plate comprises a plurality of microjets arranged as an array. In some embodiments, the impingement surface is a side opposite a side where the heat generating device is disposed. In other embodiments, the impingement surface is a side where the heat generating device is disposed. In certain embodiments, the jet plate comprises a wall jet feature disposed in the reservoir. In some embodiments, the wall jet feature extends from the jet plate to the impingement surface. In other embodiments, the wall jet feature extends upward from the impingement surface into the reservoir. In some embodiments, a channel is disposed within the wall jet feature. That channel may comprise an electrical conduit or a pathway allowing light and electromagnetic waves to pass therethrough. In certain embodiments, the assembly further comprises an effluent control feature, which extends from the jet plate to the impingement surface and directs flow of effluent toward the exhaust port. In certain embodiments, a channel may be disposed in the effluent control feature. That channel may comprise an electrical conduit or a pathway allowing light and electromagnetic waves to pass therethrough.

According to another embodiment, a method of cooling a semiconductor component is disclosed. The method comprises directing a single-phase coolant fluid through a plurality of microjets toward a surface of the semiconductor component such that the single-phase coolant fluid strikes an impingement surface; and exhausting the single-phase coolant fluid through an exhaust port away from the semiconductor component after the single-phase coolant fluid strikes the impingement surface. In certain embodiments, the method further comprises controlling the flow of effluent toward the exhaust port. In some embodiments, the effluent is routed so as to avoid an impingement surface of an adjacent microjet. In certain embodiments, the heat transfer properties are improved. In certain embodiment, the surface area of the impingement surface is increased to increase contact between the semiconductor component and the single-phase coolant fluid. In certain embodiments, wall jet features that extend perpendicular to the impingement surface are provided to increase single-phase heat transfer by boundary layer suppression and also increase contact area.

BRIEF DESCRIPTION OF THE DRAWINGS

For a better understanding of the present disclosure, reference is made to the accompanying drawings, in which like elements are referenced with like numerals, and in which:

FIG. 16 shows a perspective view of the full height features having additional functions.

DETAILED DESCRIPTION

Microjet impingement is a heat transfer technique by which a jet or an array of jets impinge onto a surface for the purpose of transferring heat between the surface and the fluid of the jet. Jets can be formed by the use of nozzles, tubes or an orifice plate and are characterized by having a substantially higher momentum in one direction than the surrounding fluid. Typically, a turbulent jet exit velocity profile is flat across the radius, reducing to zero at the edge due to the presence of the nozzle. This high velocity jet suppresses the thermal boundary layer at the heat transfer surface resulting in high heat transfer coefficients.

Adjacent fluid, particularly if it is the same fluid, is entrained into the core of the jet, spreading the momentum of the jet out to a larger and larger radius as the jet propagates downstream. At the point where the centerline of the jet meets the impingement surface, a stagnation point exists due to symmetry. Near this point, the flow turns from the direction of jet travel to parallel the impingement surface. The resulting flow is often referred to as a wall jet.

Microjets and microjet arrays can also provide higher heat transfer coefficients than other single or multi-phase technologies, while eliminating the need for any low conductance thermal interface materials, which degrade overall thermal performance.

Additionally, microjet arrays can be located closer to the electrically active region of the device than other thermal management systems and, in many cases, may be integrated into the fabrication process of the devices.

For particularly sensitive circuitry, single-phase microjets also offer a continuous phase. This may help to minimize possible transient effects on nearby circuits from sharp discontinuities in permittivity. Single phase systems also lessen the density difference between microjets and surrounding fluid, making them more robust against changes in orientation or incident inertial accelerations than two-phase (e.g., boiling) systems.

Figure 1:
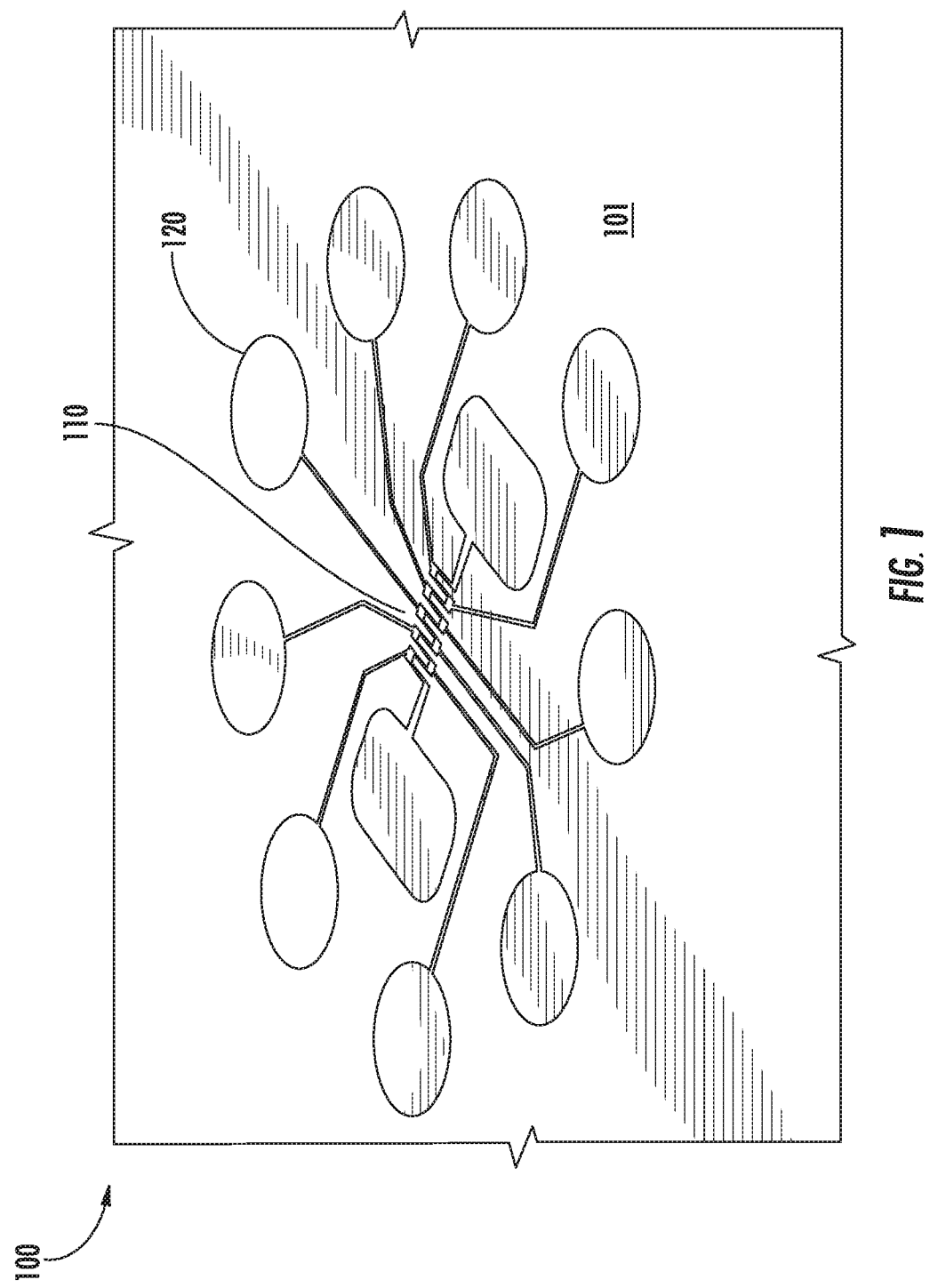
FIG. 1 is an illustration of the top surface of a substrate containing a heat generating device.

FIG. 1 shows a top surface of a component 100 having a heat generating device 110. The component 100 may be formed on or in a substrate, such as silicon, gallium nitride, gallium arsenide or others. The heat generating device 110 may comprise one or more electronic circuits, such as transistors, FETs, and other semiconductor functions. The component 100 is typically a semiconductor component, which includes at least one electronic function or circuit. The component 100 is typically formed such that the electronics, including the heat generating device 110, are exposed on one surface and not exposed on the opposite surface. For example, semiconductors are typically fabricated by etching, depositing and doping one side of the substrate. Throughout this disclosure, the surface where the heat generating device is exposed is referred to as the active surface 101 of the component 100. The opposite surface of the component 100 is referred to as the impingement surface 102. The active surface 101 of the component 100 may also include other features, such as contact pads 120.

Figure 2:
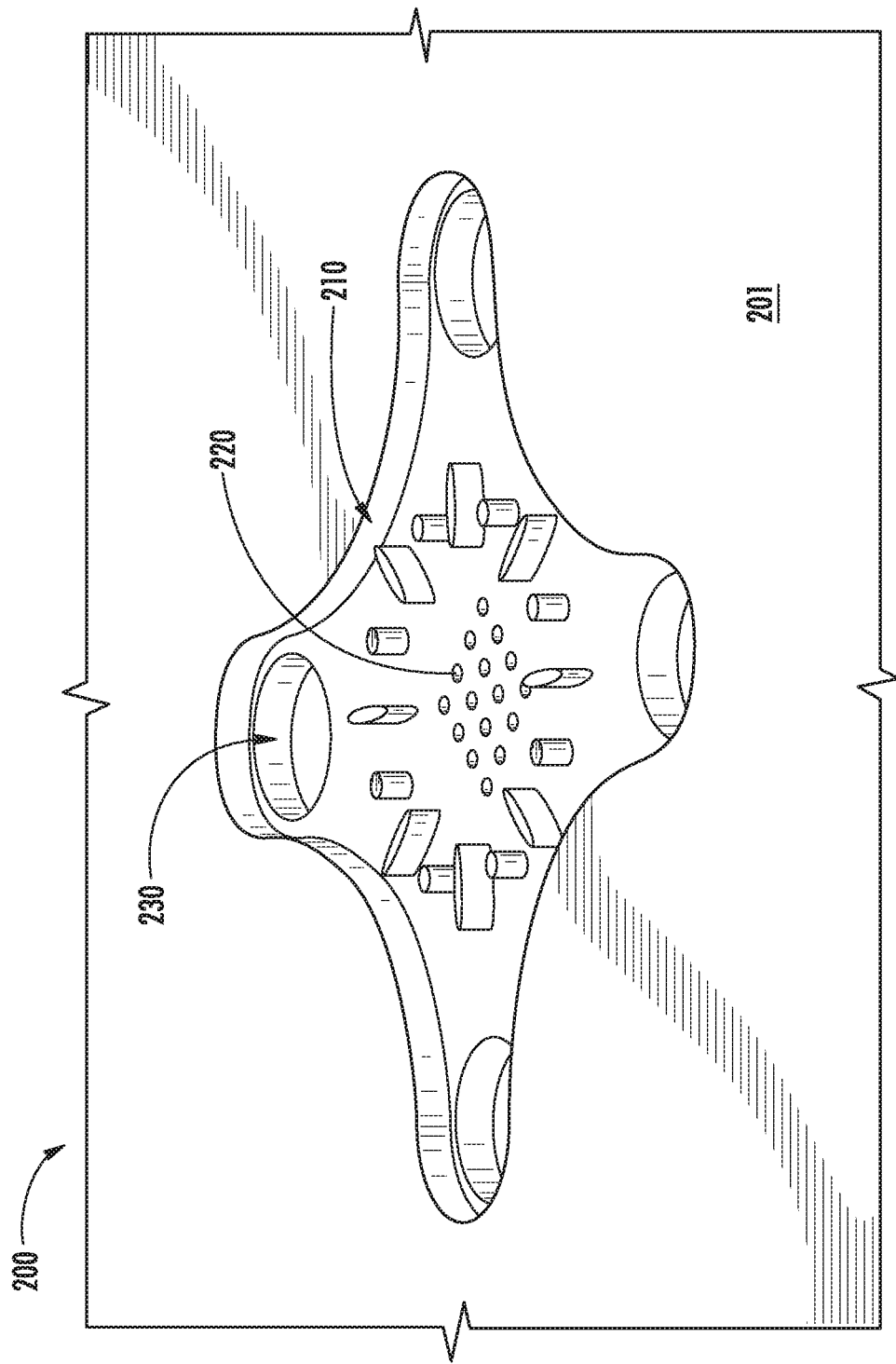
FIG. 2 is an illustration of the top surface of the jet plate that bonds to the bottom surface of the substrate.

FIG. 2 shows a top view of the jet plate 200. The jet plate 200 may be formed from a single substrate, which may be processed in accordance with traditional semiconductor fabrication processes. The top surface 201 of the jet plate 200 is bonded to the impingement surface 102 of the component 100 when assembled. The jet plate 200 has a reservoir 210 disposed on the top surface 201. This reservoir 210 defines the volume in which the coolant is disposed. The reservoir 210 may be any suitable shape, including circular, square, or irregularly shaped, as shown in FIG. 2. In certain embodiments, the jet plate 200 may have a thickness of about 450 µm, while the reservoir 210 has a depth of about 200 µm. Of course, other dimensions may be used, as long as the thickness of the jet plate 200 is sufficient relative to the depth of the reservoir 210 so as to be structurally sound and integral. In certain embodiments, the reservoir may have a top-view area of approximately 3.5 mm×3.5 mm. Of course, other dimensions may be used, as long as the reservoir area is large enough to include both the microjet or microjet array as well as the exhaust ports.

The reservoir 210 has various openings. There are one or more microjets 220 in communication with the reservoir 210. In certain embodiments, only one microjet 220 may be employed. In other embodiments, such as that shown in FIG. 2, an array of microjets 220 may be used. For example, as noted above, an array of microjets 220 may be used. This array may be square, such as 4×4, 5×5 or 6×6. In other embodiments, the array may be rectangular, such as 3×4 or 4×5. In yet other embodiments, the microjets 220 may be arranged in a plurality of concentric circles. The arrangement of the microjets 220 is not limited by this disclosure.

One or more exhaust ports 230 are also in communication with the reservoir 210. In certain embodiments, these exhaust ports 230 may be located outside of the microjets 220. In other words, the microjets 220 may be arranged in a particular configuration. The smallest perimeter that surrounds these microjets 220 does not include the exhaust ports 230. FIG. 2 shows the microjets 220 arranged as a square array, while the exhaust ports 230 are clearly outside the perimeter that defines that square. In other embodiments, the exhaust ports 230 may be disposed within the perimeter that surrounds the microjets 220.

In certain embodiments, the microjets 220 may each have a diameter in the range of 100 to 150 µm, while the exhaust ports 230 have a diameter in the range of 1 to 2 mm. Of course, other dimensions may also be used.

The microjets 220 serve as the ingress for the coolant, while the exhaust ports 230 serve as the egress.

Although not visible, the bottom surface 202 of the jet plate 200 may be planar.

Figure 3:
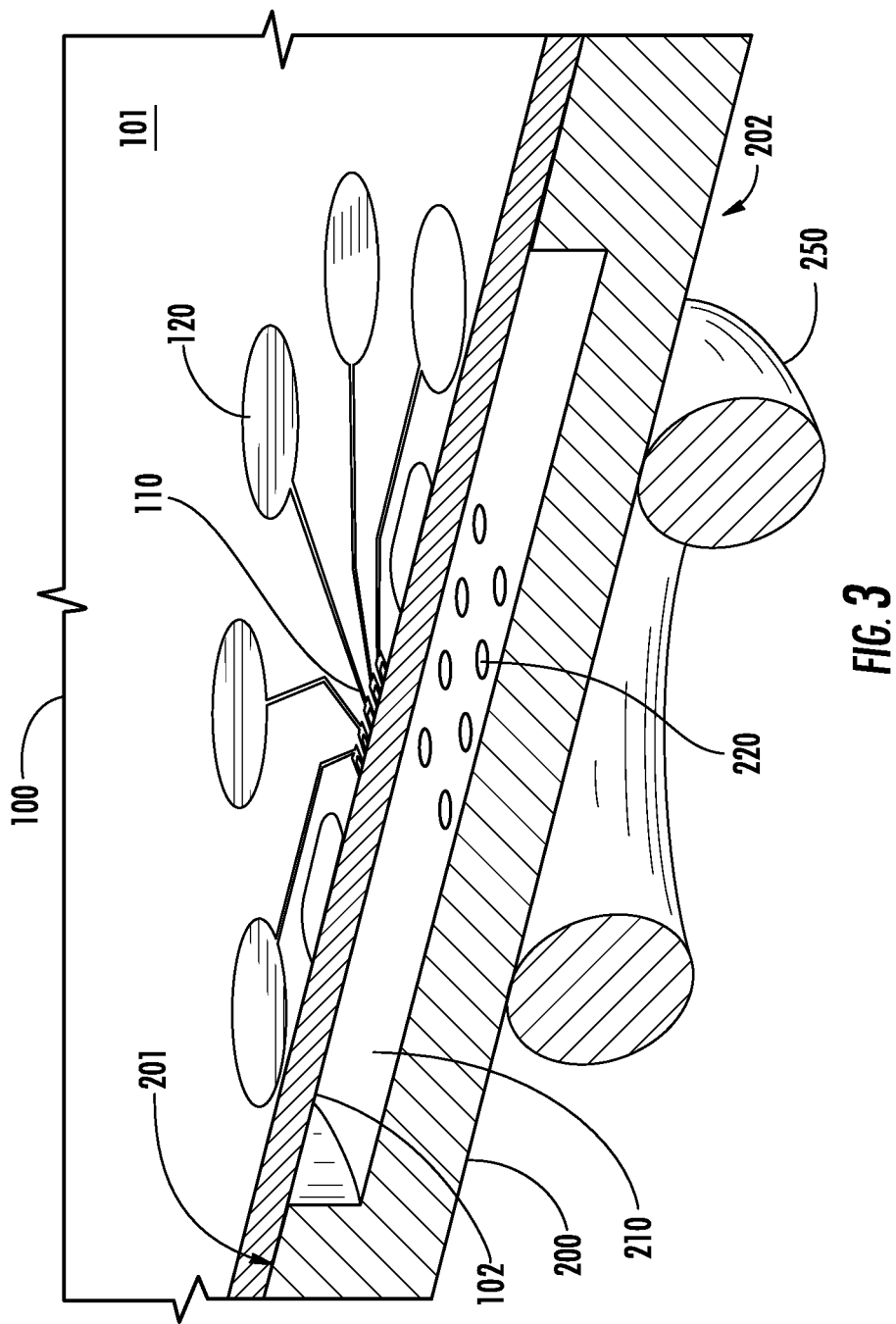
FIG. 3 is an illustration showing the jet plate bonded to the substrate.

FIG. 3 shows the assembly created by bonding the top surface 201 of the jet plate 200 to the impingement surface 102 of the component 100. The reservoir 210 becomes a sealed enclosure when bounded at the open top side by the impingement surface 102 of the component 100. When assembled, the only openings in communication with the reservoir 210 are the microjets 220 and the exhaust ports 230.

The microjets 220 are aimed at the impingement surface 102, where locally high fluid velocities, boundary layer suppression, and turbulent mixing produce extremely high convective heat transfer coefficients between the impingement surface 102 and the coolant. Microjets 220 can be arrayed geometrically to cool larger surface areas, with heat transfer coefficients from a single-phase system of greater than 400 kW/m$^2$K averaged over a 1 mm$^2$ impingement surface, as indicated by computational fluid dynamics analyses of typical geometries. This may provide significant advantages over current advanced cold plate designs having performance on the order of 1 kW/m$^2$K, and even multi-phase microchannel approaches on the order of 10 s of kW/m$^2$K.

The microjet 220 and the reservoir 210 are designed to be utilized with single-phase coolant fluid. In other words, the coolant fluid in the device does not change phase (for example, boil) within the device. The fluid microjets 220 are therefore submerged or surrounded by the reservoir 210 of the same fluid. Fluid enters the microjets 220 toward the impingement surface 102. The fluid is confined by the reservoir 210 and eventually exits through the exhaust ports 230 in the same state of matter as it entered. This eliminates any considerations related to critical heat flux (CHF) and avoids the need for complex wetting strategies, like wettability coatings, both of which must often be addressed with multi-phase systems.

The reservoir 210 is preferably positioned so as to be vertically aligned with the heat generating device 110. In this way, coolant is directed toward the impingement surface 102 directly beneath the heat generating device 110.

A gasket 250 may be disposed on the bottom surface 202 of the jet plate 200 so as create a liquid-tight seal around the microjets 220. Other means of creating a liquid-tight seal may also be used.

In operation, a pressurized coolant is in communication with the microjets 220 on the bottom surface of the jet plate 200. This coolant may be any suitable fluid, including air, water, ethylene glycol, propylene glycol, ethanol, R134A, ammonia, or a combination of two or more of these fluids. In other embodiments, other fluids may be used as the coolant. The coolant is pressurized to a pressure of about 10 psi. In certain embodiments, the pressure of the coolant may be as high as 30 psi, although other pressures may be used. The coolant may flow through a manifold (not shown) to an opening that is surrounded by gasket 250.

This pressurized coolant flows through the microjets 220 and strikes the impingement surface 102 of the component 100. The coolant may exit the microjets 220 at velocities of between 10 and 30 m/s, although other velocities may be achieved by adjusting the pressure of the coolant, or the geometry of the microjet or microjet array. Heat is transferred to the coolant in this process. The heated coolant then exits the reservoir 210 through the exhaust ports 230. The heated coolant may then be cooled externally, using a heat exchanger, or other known techniques. As stated above, the heat transfer is a single phase action, where the state of the coolant is not changed due to heat transfer. For example, the coolant may remain a liquid throughout the heat transfer process.

Figures 4, 5:
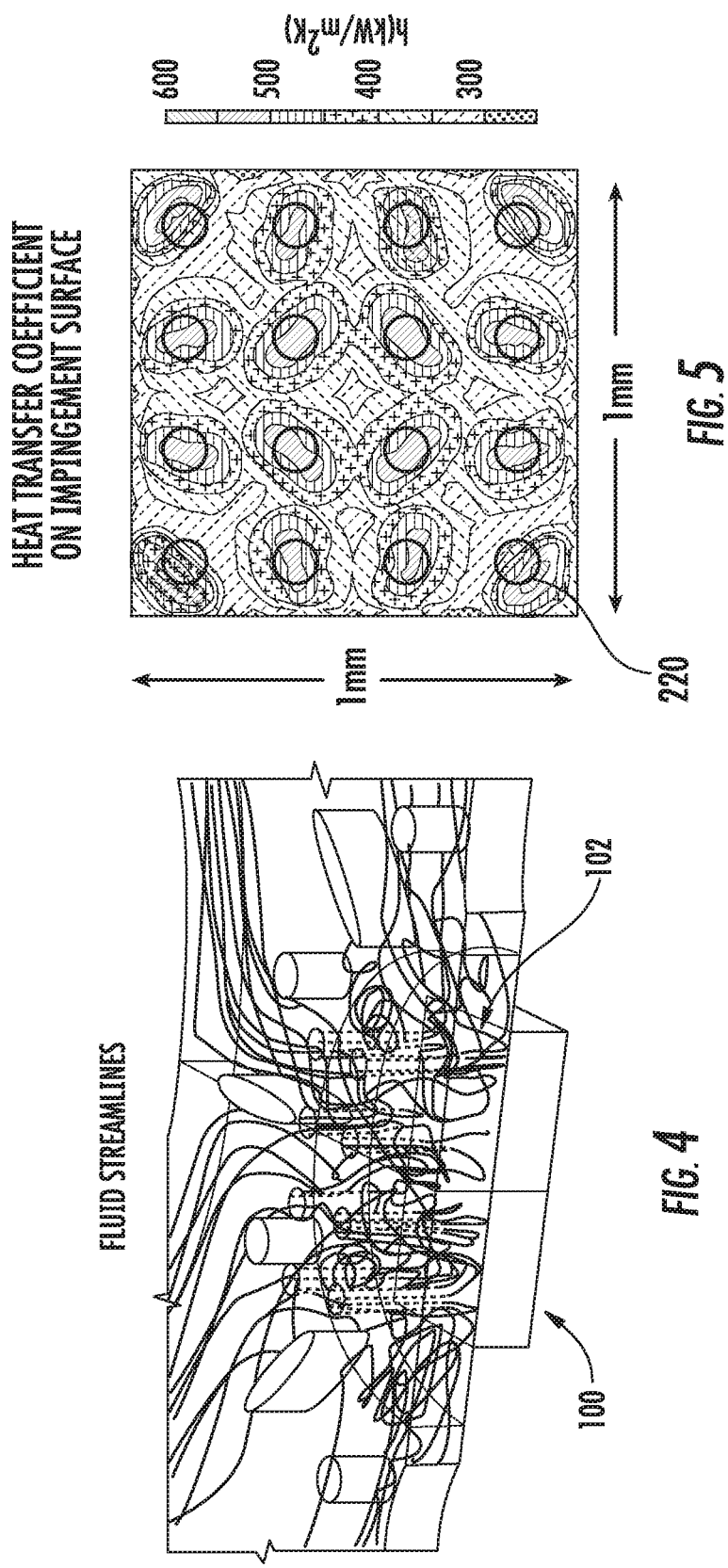
FIG. 4 shows the fluid streamlines predicted analytically for the array of microjets shown in FIG. 2.
FIG. 5 shows the heat transfer coefficient on the impingement surface.

FIG. 4 shows fluid streamlines, as predicted analytically using computational fluid dynamics. These streamlines impinge upon the impingement surface 102 of the component 100. The coolant is heated and its velocity is turned and decreases. In this figure, the coolant exits through exhaust ports located outside of the array of microjets 220. Higher velocity streams are shown in dotted lines, while lower velocity streams are shown in solid lines.

FIG. 5 shows the heat transfer coefficient on the impingement surface 102. In this figure, the microjets 220 are arranged as a 4×4 array spread over an area of 1 mm$^2$. Each microjet 220 has a diameter of 100 µm. In this example, the mean microjet velocity is 30 m/s. The heat transfer coefficient is as high as 600,000 W/m$^2$K. This heat transfer coefficient decreases moving away from the impingement zone.

Importantly, the jet plate 200 may be integrated directly with the component 100. Further, the jet plate 200 may be fabricated using the same semiconductor processes used to create the component 100.

FIG. 6A-6F shows the fabrication process according to one embodiment. FIG. 7 is a flowchart illustrating this process.

Figure 6A:
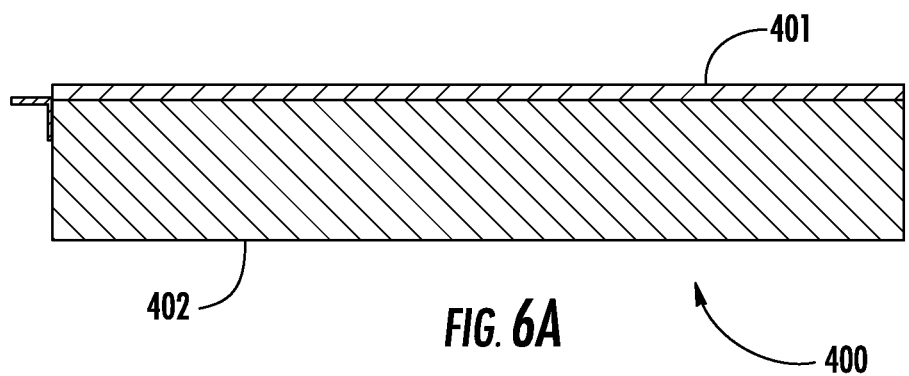
FIG. 6A-6F show the jet plate during various stages of fabrication according to one embodiment.
Figure 7:
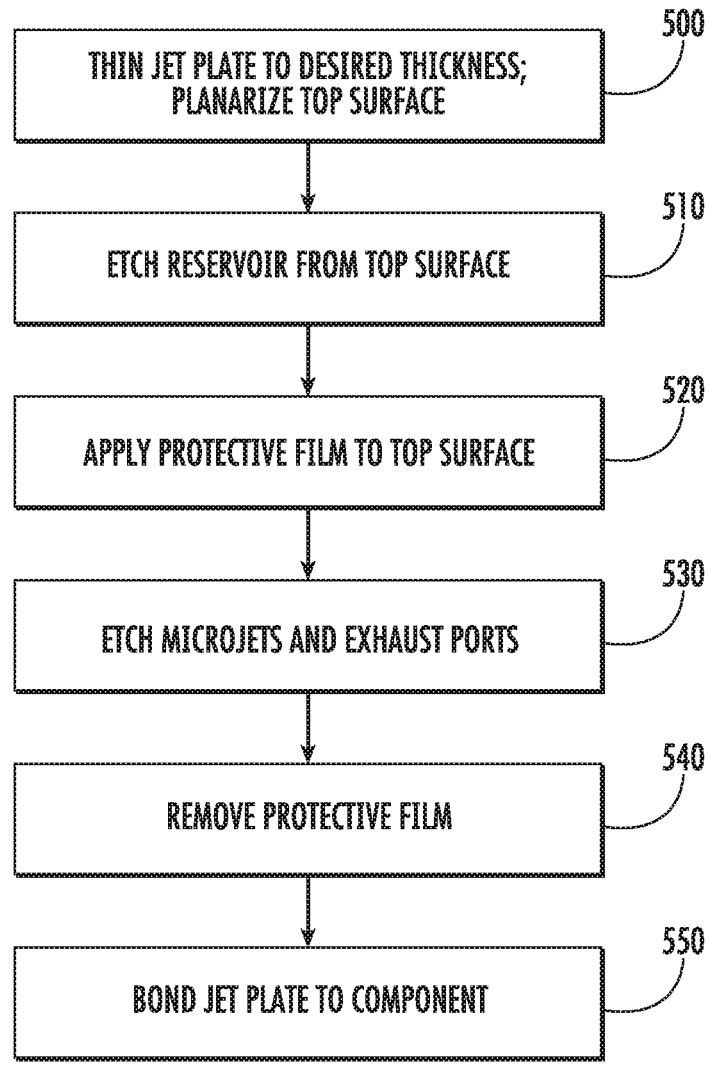
FIG. 7 shows a flowchart detailing the fabrication process of FIGS. 6A-6F.

In FIG. 6A, a substrate 400 is shown. The substrate 400 may be a silicon substrate, for example. The substrate 400 has a top surface 401 and a bottom surface 402. The substrate 400 may first by thinned to the desired thickness. This thickness may be, for example, about 500 µm, although other thicknesses may be used. In certain embodiments, a CMP (Chemical Mechanical Planarization) process is performed. In some embodiments, the top surface 401 of the substrate 400 may be planarized to within less 10 angstroms of planar. This is also shown in Process 500 of FIG. 7.

Figure 6B:
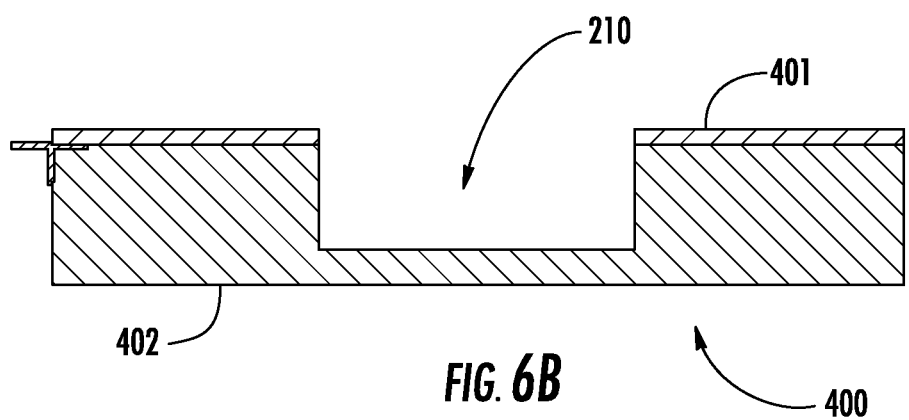

After thinning, the substrate 400 may be etched so as to create a reservoir 210, as shown in FIG. 6B and in Process 510 of FIG. 7. This etch process may be performed by disposing a mask, such as a photoresist, on a portion of the top surface 401 of the substrate 400. The etch process may be a wet etch process or a dry etch process. In certain embodiments, about 200 µm of material are etched from the top surface 401 to form the reservoir 210.

Figure 6C:
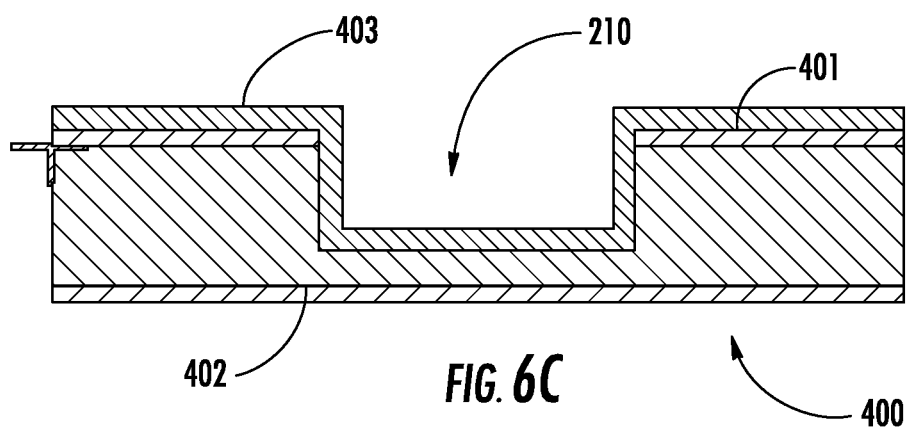

After the reservoir 210 has been formed, a protective film 403 may be applied to the top surface 401 of the substrate to protect the top surface 401 from further processing, as shown in FIG. 6C and Process 520 of FIG. 7. In certain embodiments, this protective film 403 may be a silicon nitride layer.

Figure 6D:
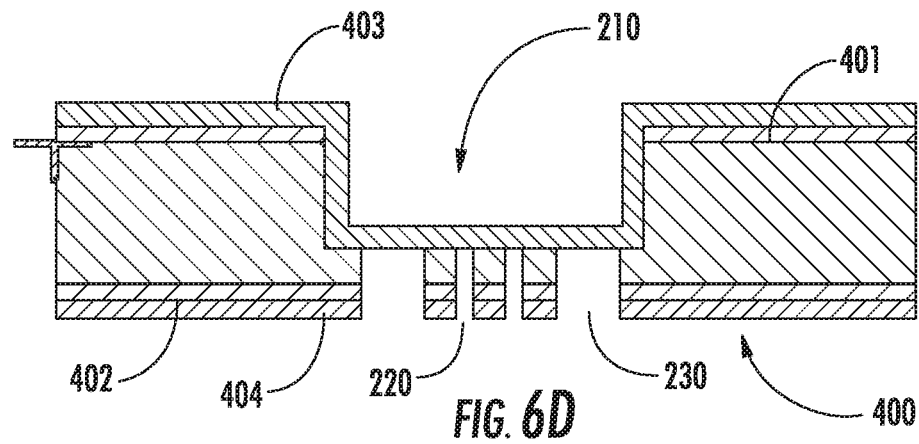

The microjets 220 and exhaust ports 230 are then etched in the substrate 400, preferably from the bottom surface 402, as shown in FIG. 6D and Process 530 of FIG. 7. This may be performed in a similar manner as the reservoir 210. In other words, this etch may be performed by disposing a mask 404, such as a photoresist, on a portion of the bottom surface 402 of the substrate 400. The mask is patterned to expose the exhaust ports 230 and the microjets 220. The etch process may be a wet etch process or a dry etch process.

Figure 6E:
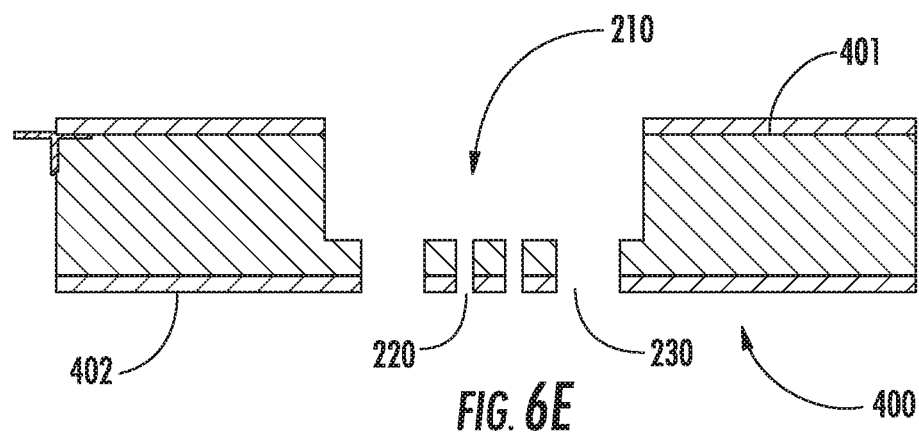

Once all of the etching has been completed, the protective film 403 is removed from the top surface, as shown in FIG. 6E and Process 540 of FIG. 7. This completes the processing of the substrate 400, as the substrate 400 has now been transformed into the jet plate 200. The jet plate 200 is now ready to be bonded to the component 100.

In certain embodiments, the impingement surface 102 of the component 100 is planarized, such that its smoothness is within less than 10 angstroms.

Figure 6F:
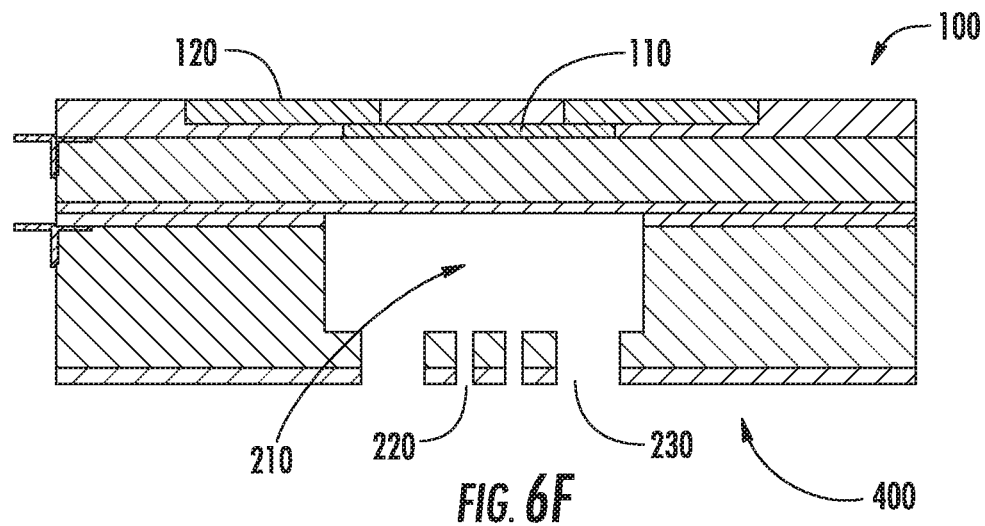

In one embodiment, the jet plate 200 is bonded to the impingement surface 102 of the component 100 simply by pressing the jet plate 200 against the component 100. If the two surfaces (the impingement surface 102 and the top surface 201) are sufficiently smooth, such as less than 10 angstroms in certain embodiments, the two parts will adhere to one another via van der Waal's forces. This may be referred to as silicon direct bonding, or silicon fusion bonding. In some embodiments, the component 100 and the jet plate 200 may be heated prior to the bonding process, or bonded by other methods including eutectic gold bonds, indium solders, or other adhesives. In certain embodiments, prior to the bonding process, the parts, which may be silicon, may be exposed to oxygen or the ambient environment, so as to create a thin film of silicon oxide on the outer surfaces. In other certain embodiments, a conductive ground plane may be included between the jet plate and the impingement surface. Of course, other techniques may be used to create a silicon oxide film on the surfaces of the component 100 and the jet plate 200. The assembly after the bonding process is completed is shown in FIG. 6F and Process 550 of FIG. 7.

Variations of the process shown in FIGS. 6A-6F and FIG. 7 are also possible. For example, it is possible to etch the microjets 220 and exhaust ports 230 prior to creating the reservoir 210. In other words, processes 510 and 530 may be performed in the opposite order. In this variation, it may be beneficial to apply a mask or protective film to the top surface 401 of the substrate 400 prior to etching the microjets 220 and exhaust ports 230 to minimize damage done to the top surface 401.

In certain embodiments, it may be advantageous to perform an alignment process to align the jet plate 200 to the component 100 prior to bonding. This may be performed in several ways.

In one embodiment, a metal alignment key is provided in a location in the impingement surface 102 and in a corresponding location in the top surface 201 of the jet plate 200. To minimize disruption to the bonding process, these metal alignment keys may be depressed into these respective surfaces. For example, a small region of the impingement surface 102 may be etched to create a recess. A metal may be deposited in this recess. A similar process may be performed to the top surface 401 of the substrate 400. In certain embodiments, these metal alignment keys are complementary shapes, such that the component and jet plate are aligned when the shapes fit together. When the bonding process begins, an infrared (IR) camera may be used to perform the alignment. Silicon is transparent to IR light, so only the metal alignment keys will be visible on the image. These metal alignment keys may then be manually aligned. In other embodiments, the alignment may be executed automatically by an apparatus that includes the IR camera and an x-y moveable stage.

Figure 8A:
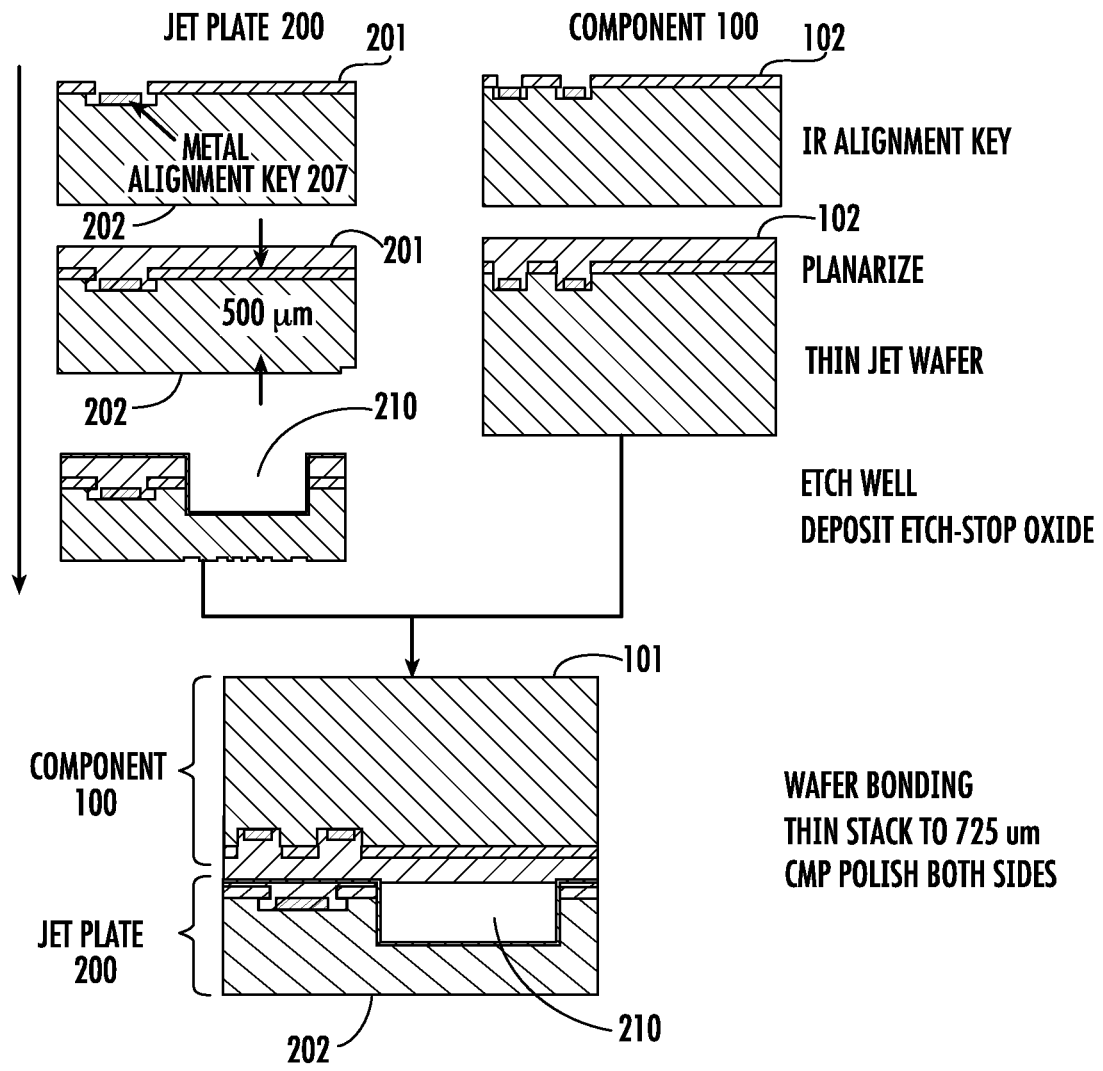
FIG. 8A-8B show the fabrication of the assembly according to another embodiment.
Figure 8B:
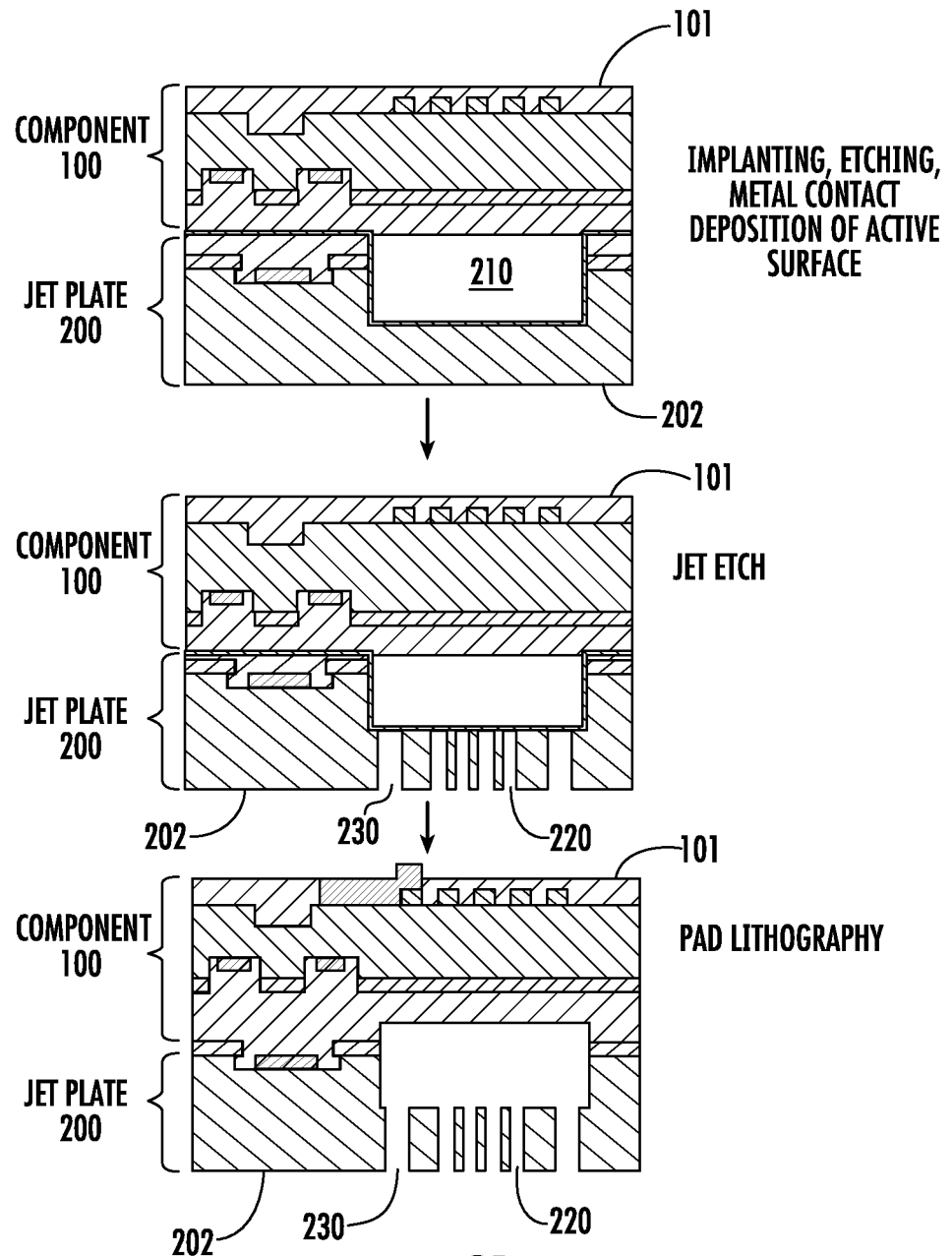

FIGS. 8A-8B show a fabrication process according to another embodiment. In this embodiment, many of the process steps are performed after the jet plate 200 has been bonded to the component 100.

First, as described above, the metal alignment keys are created in the jet plate 200 and the component 100. In this embodiment, the metal alignment key 207 of the jet plate 200 is configured to appear within the metal alignment key of the component 100 when the parts are aligned. The metal alignment key is disposed in the top surface 201 of the jet plate 200 and the impingement surface 102 of the component 100.

Next, the jet plate 200 and the component 100 are planarized and thinned. As shown in FIG. 8A, the jet plate 200 may be thinned to a thickness of about 500 μm, although other thicknesses may also be used.

The reservoir 210 is then etched into the top surface of the jet plate 200. This etch process may be performed as described above with respect to FIG. 6B.

The component 100 and the jet plate 200 are then bonded together. In certain embodiments, the impingement surface 102 of the component and the top surface 201 of the jet plate 200 may be smoothed at this time, such as by a CMP process. This bonding may be performed using the technique described in FIG. 6F. The bonding of these two parts creates a stack. Note that the outer surfaces of the stack have not yet been processed. Rather, only the alignment keys and reservoir have been created.

FIG. 8B shows the subsequent processing of the jet plate 200 and the component 100. First, the active surface of the component 100 may be processed. This processing may include implanting, metal deposition, etching and other traditional semiconductor fabrication processes.

The microjets 220 and exhaust ports 230 are then etched into the bottom surface of the jet plate 200. This may be done in a manner similar to that in FIG. 6D.

Finally, the active surface 101 may be further processed, such as by performing pad lithography. Of course, in certain embodiments, the entirety of the active surface 101 may be processed before the bottom surface 202 of the jet plate 200 is processed. In yet another embodiment, the bottom surface 202 of the jet plate 200 may be processed before the active surface 101 of the component 100.

In other words, there are various fabrication methods that may be used. In one embodiment, shown in FIGS. 6A-6F, each part (i.e. the jet plate 200 and the component 100) is completely fabricated prior to being bonded together. In another embodiment, shown in FIGS. 8A-8B, only the surfaces of the jet plate 200 and the component 100 that are to be bonded are processed prior to bonding. All other processing is performed after bonding is complete. In another embodiment, the internal surfaces are processed prior to bonding, as is performed in FIG. 8A. However, at least one fabrication step is performed on the active surface 101 of the component or the bottom surface 202 of the jet plate 200 prior to the bonding.

In all embodiments, when completed, the assembly comprises a component 100, such as a semiconductor device, having a heat generating device, which is bonded on one surface to a jet plate 200. Further, both parts, the component 100 and the jet plate 200, can be fabricated using the same semiconductor processes. This helps reduce size and weight. Integration may also improve the thermal performance of this thermal management system as the thickness of the component 100 can be optimized and built into the fabrication sequence.

In summary, unlike existing thermal management solutions, the jet plate 200 with microjets 220 can be integrated directly into the component 100, reducing the conductive resistance through the component 100. The combination of short conductive path to the impingement surface 102 and high convective heat transfer coefficients of the microjets 220 significantly reduces the peak device temperature (at fixed duty cycle and power output) compared to existing thermal management solutions. Moreover, in single-phase embodiments, single-phase microjets 220 provide convective heat transfer coefficients that meet or exceed those of multi-phase systems, but, unlike multi-phase systems, do not exhibit limitations such as critical heat flux, dryout, or a need for exotic wettability coatings.

Additional enhancements may be made to the microjets described above.

Figure 9:
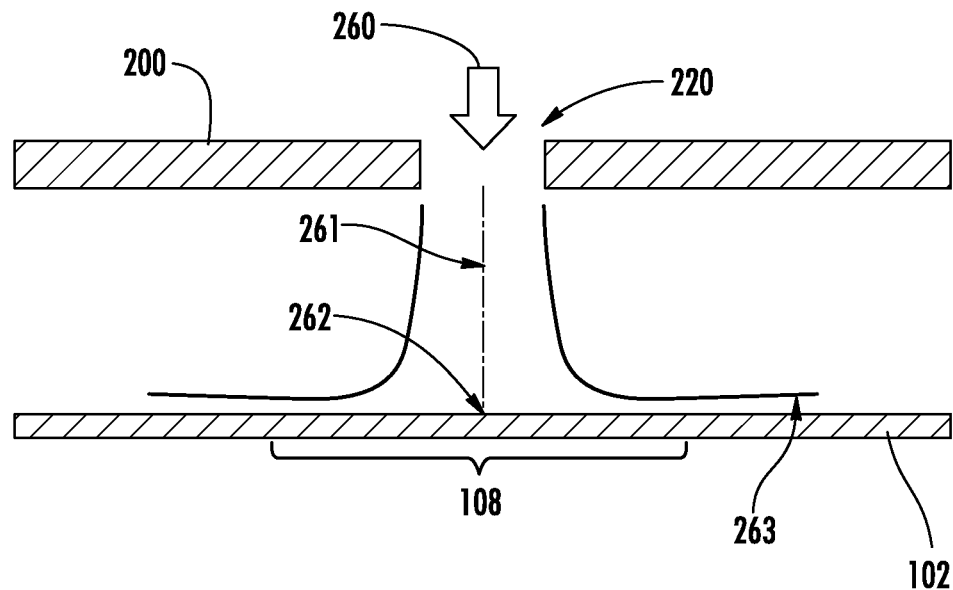
FIG. 9 shows the fluid flow through a microjet.

FIG. 9 shows a cross-sectional view of a jet 260, as it passes through a microjet 220 in the jet plate 200 and strikes an impingement surface 102. Adjacent fluid, particularly if it is the same fluid, is entrained into the core of the jet 260 spreading the momentum of the jet 260 out to a larger and larger radius as the jet 260 propagates downstream. At the point where the centerline 261 of the jet 260 meets the impingement surface 102, a stagnation point 262 exists due to symmetry. Near this stagnation point 262, the flow turns from perpendicular to the impingement surface 102 to parallel to the impingement surface 102. The resulting parallel flow is often referred to as a wall jet 263. Further, the portion of the impingement surface 102 that is impinged in a perpendicular or substantially perpendicular direction is referred to the impingement zone 108.

Figure 10:
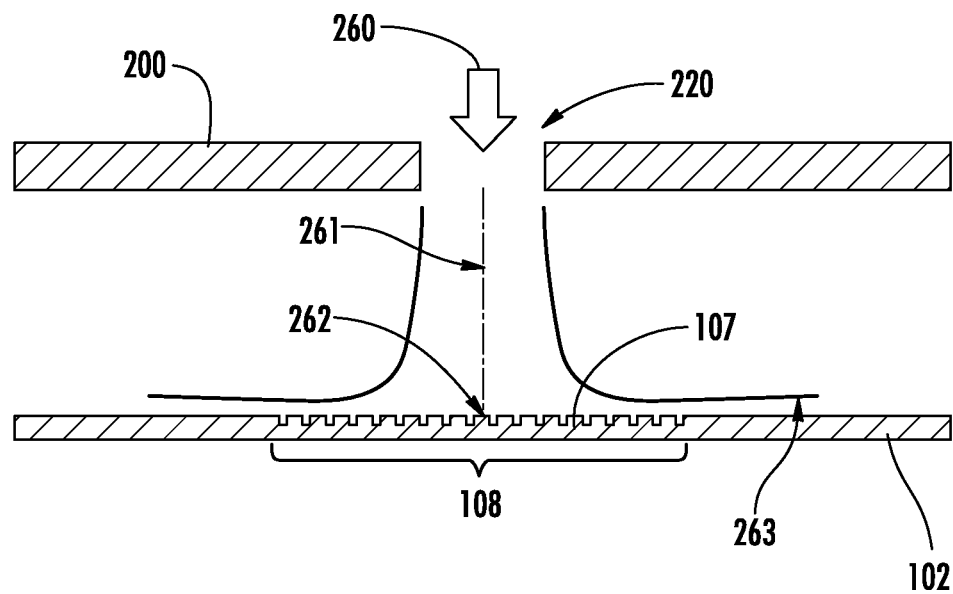
FIG. 10 shows area enhancement structures located in the impingement zone.

The average heat transfer coefficient and the surface area of the impingement zone 108 dominate the heat transfer in microjet implementations. Thus, in one embodiment, the surface area of the impingement surface 102, and particularly the impingement zone 108, is increased by creating structures on the impingement surface 102, as shown in FIG. 10. These area enhancement structures 107 may be rectangular prisms, ranging in height. In one embodiment, the area enhancement structures 107 are formed by etching the impingement surface 102 of the component 100 prior to bonding the component 100 to the jet plate 200. In other embodiments, the area enhancement structures 107 may be formed by depositing material on the impingement surface 102 prior to bonding. Of course, in other embodiments, the area enhancement structures 107 may be different shapes.

Figure 11:
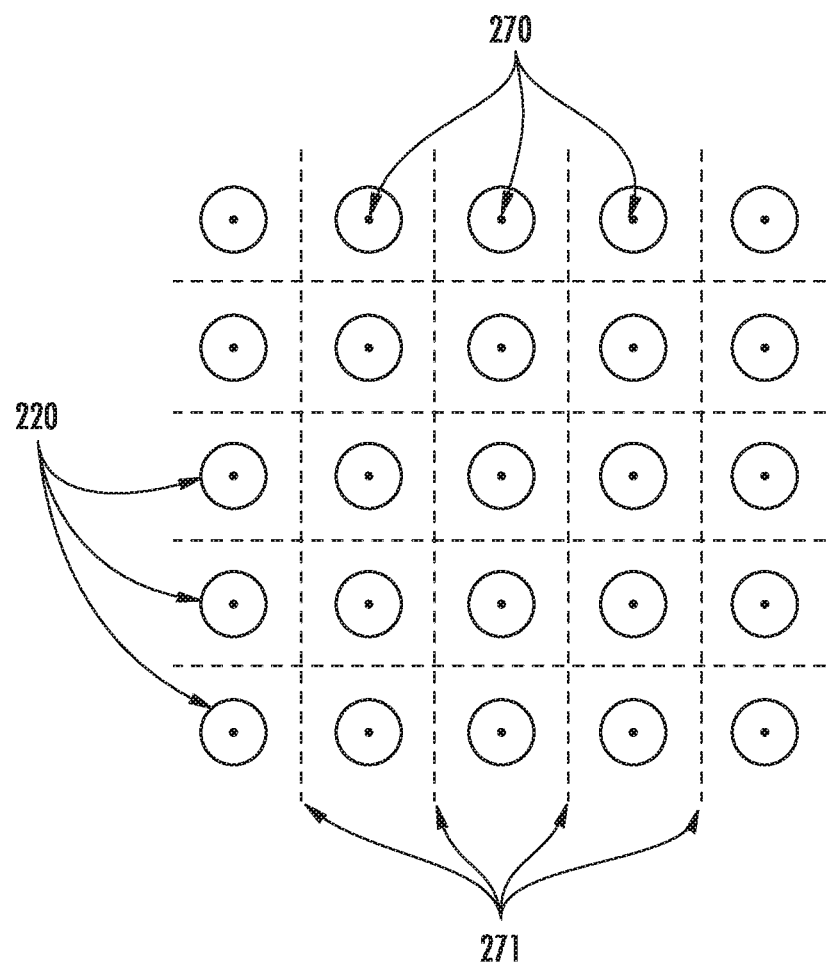
FIG. 11 shows primary and secondary stagnation points in a microjet array.

As described above with respect to FIG. 9, the jet creates a wall jet 263 as it travels parallel to the impingement surface 102. If an array of jets is used, such as is shown in FIG. 2, wall jets from each microjet 220 will interact with its neighbors. This interaction creates a secondary stagnation point, which is equidistant from adjacent microjets 220. An array of microjets 220 may therefore exhibit degraded performance due to these secondary stagnation points and cross-talk between neighboring microjets. FIG. 11 shows an array of microjets 220. As described above, at the center of each microjet 220, a primary stagnation point 270 is created. Further, at points equidistant from adjacent microjets 220, secondary stagnation points 271 are created.

Some of the multifunctional features described herein not only mitigate the cross-talk between neighboring microjets 220, but actually increase the thermal performance of the overall array of microjets 220.

Figure 12:
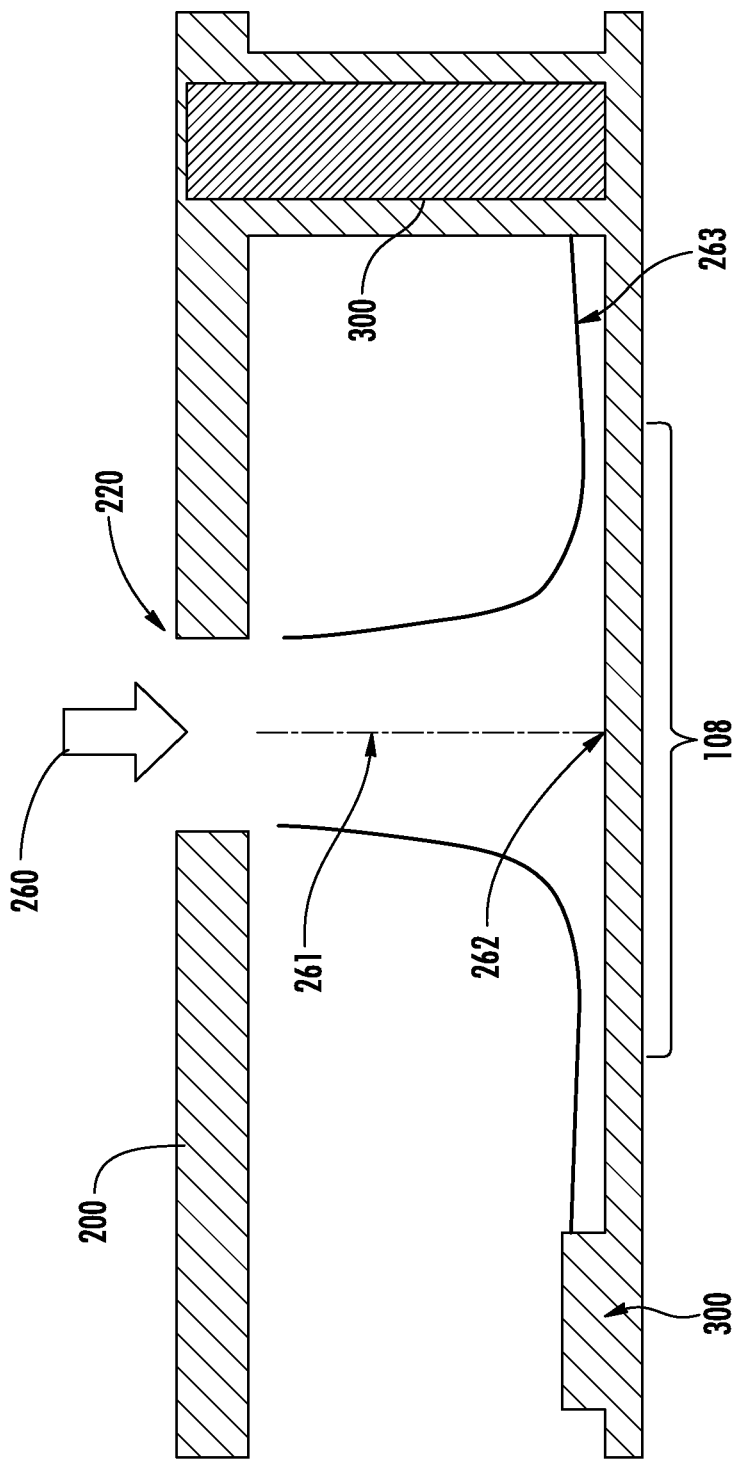
FIG. 12 shows an example of wall jet features.

In one embodiment, the multifunctional features are implemented to increase the overall heat transfer effectiveness by exploiting the heat transfer potential from the wall jets 263. For example, wall jet features 300 may be constructed which are perpendicular to the flow of the wall jets 263, as shown in FIG. 12. When the wall jets 263 impinge on the wall jet features 300, an additional impingement zone is created, thus creating higher heat transfer coefficients at this locality. The creation of additional impingement zones, by exploiting the wall jets, increases the average heat transfer coefficient of the device.

Figure 13:
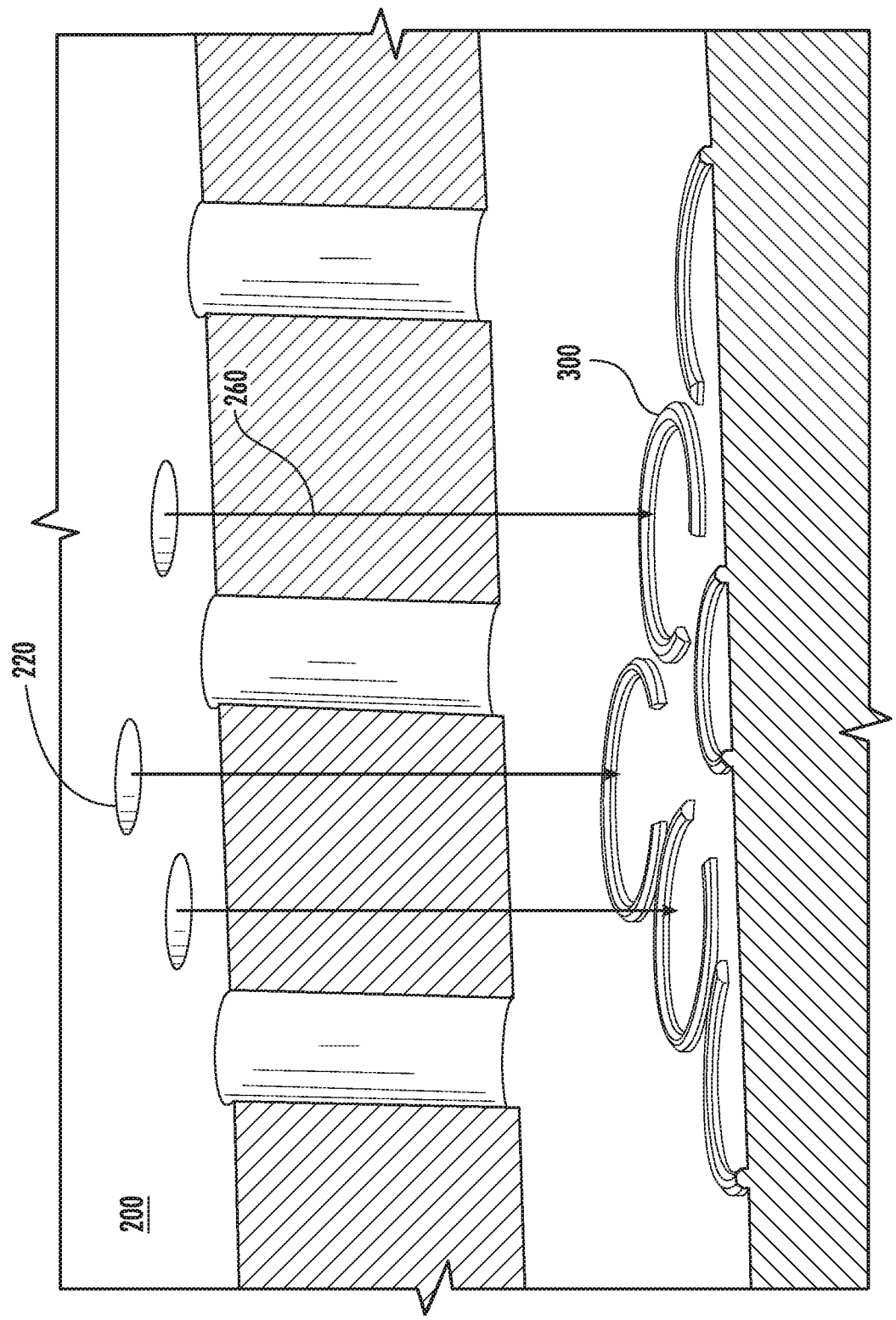
FIG. 13 shows a perspective view of the impingement surface with wall jet features.

The wall jet features 300 may vary in height. For example, the wall jet feature 300 may extend from the jet plate 200 to the impingement surface 102, as shown on the right side of FIG. 12. This is referred to as a full height feature. In this embodiment, the wall jet feature 300 may be formed on either the jet plate 200, or on the impingement surface 102 of the component 100. In another embodiment, the wall jet feature 300 may extend only part of the way from the impingement surface 102 to the jet plate 200. This height may be acceptable, as the wall jet 263 does not exist at a significant velocity above the impingement surface 102. For example, the partial height wall jet features, shown as those shown in FIG. 13, may extend upward about 10 to 50 μm from the impingement surface 102.

Wall jet features 300 differ from area enhancement structures 107 in several ways. First, the function of each is different. The area enhancement structures 107 are intended to increase the surface area of the impingement zone 108. Thus, the exact shape of the area enhancement structures 107 is not important; rather it is the fact that protrusions on the impingement surface 102 increase the surface area of the impingement zone 108 that is important. In contrast, the wall jet features 300 are designed to be perpendicular to the flow of the wall jet 263. Secondly, these features are disposed in a different location on the impingement surface 102. As seen in FIG. 10, the area enhancement structures 107 are disposed in an impingement zone 108, which the jet 260 strikes at a perpendicular or nearly perpendicular angle. In contrast, the wall jet features 300 are positioned farther from the microjets 220, where the flow of the jet 260 has become substantially parallel to the impingement surface 102. Stated differently, the area enhancement structures 107 are typically disposed on the impingement surface proximate the microjet 220 in the impingement zone 108. In contrast, the wall jet features 300 are disposed farther away from the microjets 220, outside of the impingement zone 108. The left side of FIG. 12 shows an example of a wall jet feature 300, which is partial height. These partial height wall jet features 300 would be incorporated in the impingement surface 102 of the component 100.

Some multifunctional features may also be utilized to control or manipulate the fluid flow characteristics. This flow control may help avoid deleterious effects, such as cross-talk and wash-out typically observed in large arrays. Specifically, the coolant that enters the array via a microjet 220 must exit the reservoir 210. The flow of this fluid away from the center of the array of microjets 220 may have a deleterious effect on the downstream stagnation area heat transfer coefficients.

Assume an array of microjets 220 configured as a 3×3 array. Coolant that strikes the impingement zone 108 below the center microjet 220 must exit the reservoir 210 and reach the exhaust ports 230. The flow of this effluent may pass over the impingement zones 108 of the outer microjets 220, thereby reducing the heat transfer coefficient at those regions. Thus, to counteract this effect of effluent flow, effluent flow control features may be incorporated into the jet plate 200 or the impingement surface 102.

Figure 14:
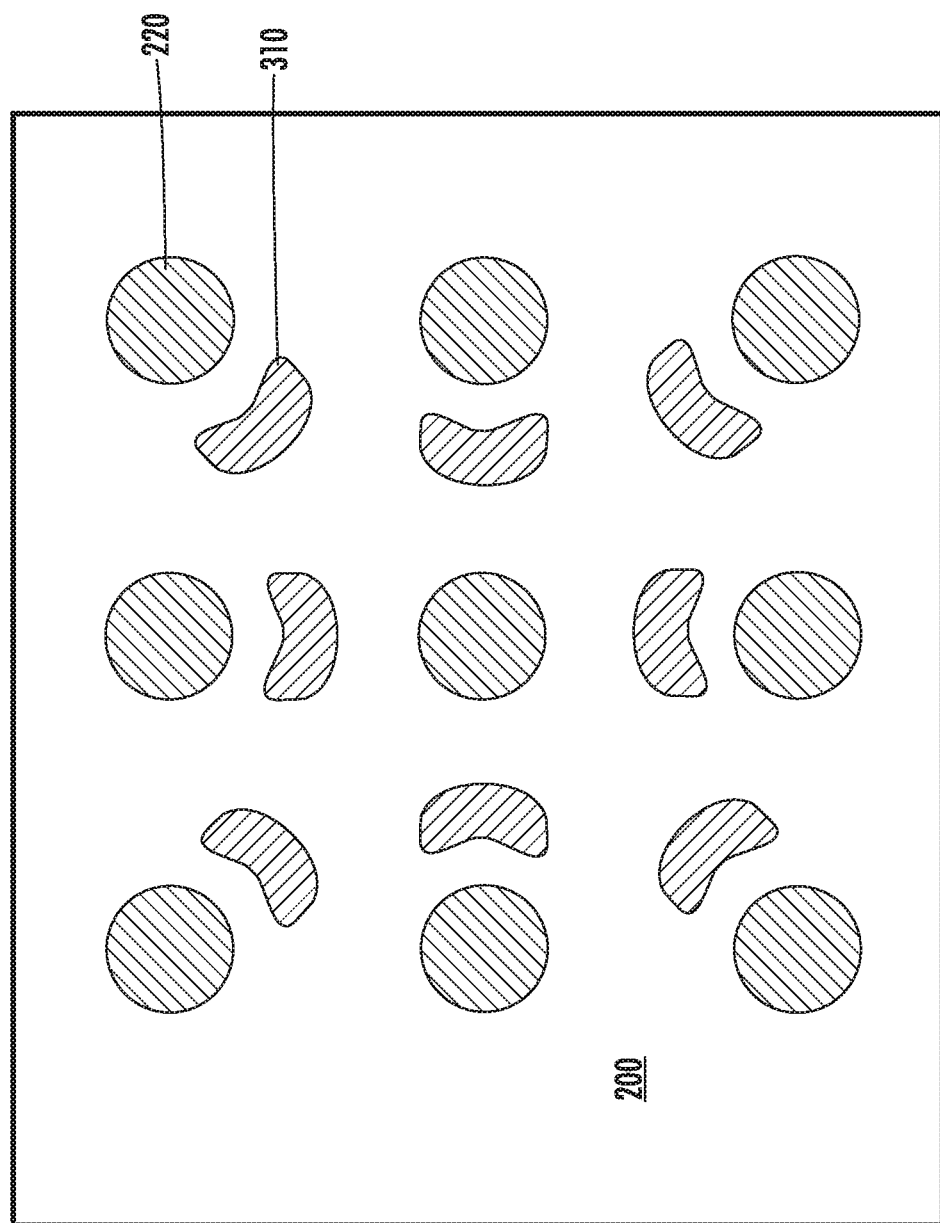
FIG. 14 shows an example of effluent flow control features.

FIG. 14 shows a view of a jet plate 200 that includes an array of microjets 220 and effluent flow control features 310. In this embodiment, the effluent flow control features 310 are arranged to direct effluent from the center microjet 220 away from the impingement zones of the surrounding eight microjets 220. Thus, each of the eight surrounding microjets 220 is configured with an effluent flow control feature 310 that is disposed between it and the center microjet 220. These effluent flow control features 310 force the effluent from the center microjet 220 to flow between the impingement zones of the outer microjets 220. While FIG. 14 shows the effluent flow control features configured in one particular way, the disclosure is not limited to only this configuration. Any configuration where the effluent is routed due to the presence of the effluent flow control features 310 may be employed. In many embodiments, the effluent flow control features 310 are used to route effluent from one microjet in such a way that it does not pass over the impingement zone of another microjet in the array.

In certain embodiments, the effluent flow control features 310 are full height. This term implies that the effluent flow control features 310 occupy all of the vertical space between the impingement surface 102 and the jet plate 200. In other words, this term implies that the feature is the same height as the depth of the reservoir 210 (see FIG. 2).

Full height features can be fabricated in several ways. First, these full height features may be formed as an integral part of the jet plate 200. In other words, when the jet plate 200 is etched to form the reservoir 210, photoresist or other masks are disposed over certain areas within the reservoir 210, so that these areas are not etched when the reservoir 210 is created. This would result in a full height feature. Alternatively, the full height features may be incorporated in the component 100. This may be done through additive or subtractive processes. In a third embodiment, part of the full height feature is formed on the impingement surface 102 of the component 100, while the remainder of the full height feature is formed on the jet plate 200.

Full height features may serve many purposes. For example, as described already, these features may serve as wall jet features 300 or effluent flow control features 310. However, full height features may serve other functions as well. First, since these features extend across the reservoir 210, they can also serve as structural elements, further increasing the integrity of the jet plate 200. As structural elements, the full height features serve to reinforce the jet plate 200 in the area of the reservoir 210, potentially allowing thinner components 100, which may be advantageous thermally for minimizing resistance in the component substrate.

Additionally, the full height features may also serve as alignment features during the bonding process. These full height features may also be used to control tolerancing of the device stackup as well.

Figure 15:
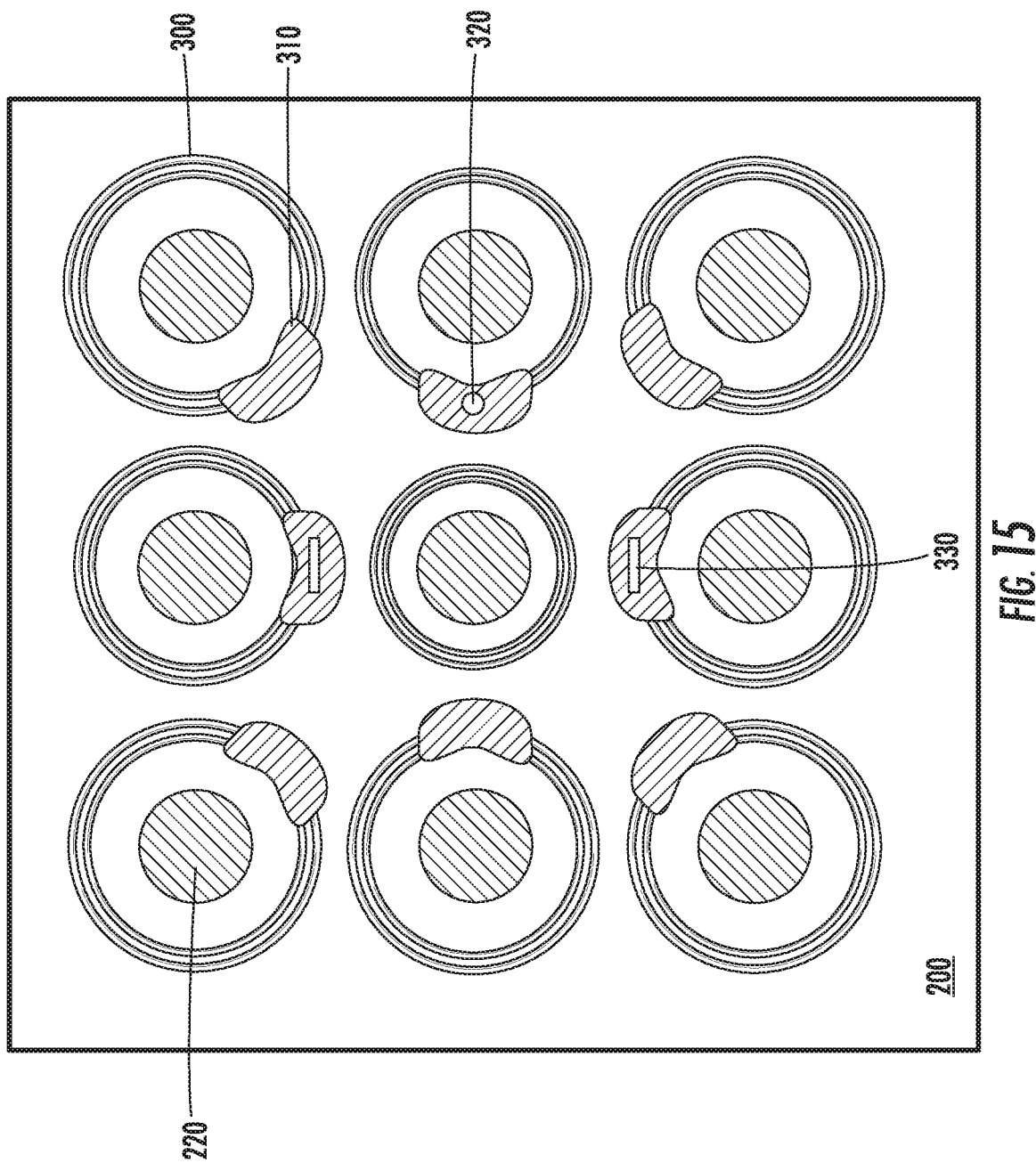
FIG. 15 shows a top view of full height features having additional functions.

Full height features may serve other functions, some of which are shown in FIG. 15. FIG. 15 shows wall jet features 300, which are partial height, surrounding each of a plurality of microjets 220. Effluent flow control features 310 are also shown, which are full height. FIG. 16 shows a perspective view of several full height features, which may also be effluent flow control features 310. In certain embodiments, an electrically conductive conduit 320 is created through one or more full height features, such as effluent flow control features 310. These electrically conductive conduits 320 may be formed by etching a column 340 (see FIG. 16) within the full height feature, and then filling the column with an electrically conductive material, such as a metal. The electrically conductive conduit is exposed on the top surface of the full height feature, such that when bonded to the component, is in direct contact with the impingement surface 102. The electrically conductive conduit 320 may pass through the entirety of the jet plate 200, and be accessible on the bottom surface 202 of the jet plate 200. A conductive pad may be disposed on the impingement surface 102 of the component 100, which aligns with the electrically conductive conduit 320 when the jet plate 200 is bonded to the component 100. This allows certain electrical signals to be accessible on the bottom surface 202 of the jet plate 200. In certain embodiments, the jet plate 200 may include electrical conduits so that an electrical signal from one full height feature may be routed to the electrical signal of a second full height feature, if desired.

Additionally, the full height features may also be fabricated so as to include a pathway 330 therethrough. This pathway 330 may be used as a waveguide for electromagnetic waves or light. Thus, the pathway 330 may allow electromagnetic waves or light to travel from the bottom surface 202 of the jet plate 200 to the impingement surface 102.

While FIGS. 15 and 16 show effluent flow control features 310, any full height feature may be used to serve any of these functions. As described above, these functions include wall jet features, effluent flow control features, structural elements, alignment mechanisms, electrically conductive conduits, or waveguides. In certain embodiments, a full height feature may perform two or more of these functions.

The jet plate 200 is intended for use in single-phase systems. However, it is understood that the enhancements to the jet plate 200 and the impingement surface may apply to both single-phase and multi-phase systems. For example, the wall jet features, and effluent flow control features may be applied to both single-phase and multi-phase systems.

In one embodiment, the present disclosure discloses a method of cooling a semiconductor component. First, one side of the jet plate 200 is attached, adhered or otherwise connected to the semiconductor component. In certain embodiments, the jet plate 200 is attached to the side of the semiconductor component opposite the heat generating device 110. A source of pressurized coolant fluid is then connected to the opposite side of the jet plate 200. A sink or return for exhausted fluid is then attached to the exhaust ports of the jet plate 200. A coolant fluid is then introduced through the microjet array. Importantly, this is a single-phase coolant fluid, meaning that it does not change phase (i.e. boil). The coolant fluid strikes the impingement surface of the semiconductor component and is then exhausted through the exhaust port into the sink. In certain embodiments, the heat transfer properties are improved by increasing the surface area of the impingement surface. In certain embodiments, the heat transfer properties are improved by providing wall jet features, which extend perpendicular to the impingement surface. These wall jet features are impacted by the jet wall as it moves away from the impingement surface. In certain embodiments, the heat transfer properties are increased by routing the effluent toward the exhaust ports. The effluent flow control features may route the effluent so that it avoids the impingement surfaces of adjacent microjets in the array. In certain embodiments, the single-phase coolant fluid strikes the surface of the semiconductor component. In other embodiments, a conductive ground plane may be disposed on the side of the semiconductor component opposite the heat generating device. In these embodiments, the single-phase coolant fluid strikes the ground plane.

In certain embodiments, the jet plate 200 may be attached to the side of the semiconductor component where the heat generating device is disposed. In these embodiments, the coolant fluid must be electrically non-conductive. For example, air may be used as the coolant fluid in this embodiment.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure.

Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed:

1. An assembly, comprising:
   a semiconductor component, formed on a semiconductor substrate, and the semiconductor component having a heat generating device disposed therein, wherein the semiconductor substrate is a substrate made of a semiconductor material, and wherein one surface of the semiconductor substrate is referred to as an impingement surface;
   a jet plate made of a semiconductor material, wherein the jet plate is directly bonded to the impingement surface of the semiconductor component, where a reservoir is formed within the assembly as a sealed enclosure bounded by the jet plate and the impingement surface of the semiconductor component; and
   a single-phase fluid disposed in the reservoir, in direct contact with the impingement surface of the semiconductor component, wherein the jet plate comprises at least one microjet and at least one exhaust port in communication with the reservoir.

2. The assembly of claim 1, wherein the at least one microjet of the jet plate comprises a plurality of microjets arranged as a two-dimensional array.

3. The assembly of claim 2, wherein a smallest perimeter that surrounds the two-dimensional array does not include the at least one exhaust port.

4. The assembly of claim 1, wherein the impingement surface is a surface of the semiconductor substrate opposite a surface of the semiconductor substrate where the heat generating device is disposed.

5. The assembly of claim 1, wherein the impingement surface is a surface of the semiconductor substrate where the heat generating device is disposed.

6. The assembly of claim 1, further comprising an alignment key disposed on the semiconductor component and configured to align with a corresponding alignment key disposed on a top surface of the jet plate.

7. The assembly of claim 1, wherein a source of pressurized fluid is in communication with the at least one microjet.

8. The assembly of claim 1, wherein the jet plate comprises a wall jet feature disposed in the reservoir.

9. The assembly of claim 8, wherein the wall jet feature extends from the jet plate to the impingement surface.

10. The assembly of claim 8, wherein the wall jet feature extends upward from the impingement surface into the reservoir.

11. The assembly of claim 10, wherein the wall jet feature extends so as to contact the jet plate.

12. The assembly of claim 11, wherein a channel is disposed within the wall jet feature.

13. The assembly of claim 12, wherein the channel comprises an electrical conduit.

14. The assembly of claim 12, wherein the channel comprises a pathway allowing light and electromagnetic waves to pass therethrough.

15. A method of cooling a semiconductor component formed on a semiconductor substrate, the semiconductor component having a heat generating device disposed therein, wherein the semiconductor substrate is a substrate made of a semiconductor material, and wherein one surface of the semiconductor substrate is referred to as an impingement surface, comprising:
   directly bonding a jet plate to the impingement surface, wherein the jet plate is made of a semiconductor material;
   directing a single-phase coolant fluid through a plurality of microjets in the jet plate toward the impingement surface such that the single-phase coolant fluid strikes the impingement surface; and
   exhausting the single-phase coolant fluid through a at least one exhaust port of the jet plate away from the semiconductor substrate after the single-phase coolant fluid strikes the impingement surface.

16. The method of claim 15, wherein the impingement surface is the one surface of the semiconductor substrate opposite a surface of the semiconductor substrate where the heat generating device is disposed.

17. The method of claim 15, wherein the impingement surface is the one surface of the semiconductor substrate where the heat generating device is disposed.

18. The method of claim 15, wherein the plurality of microjets of the jet plate are arranged as a two-dimensional array.

19. The method of claim 18, wherein a smallest perimeter that surrounds the two-dimensional array does not include the at least one exhaust port.

* * * * *